United States Patent
Senoo

(10) Patent No.: US 9,528,882 B2
(45) Date of Patent: Dec. 27, 2016

(54) ROTOR TEMPERATURE DETECTING DEVICE IN AN ELECTRIC MOTOR AND OVERHEAT PROTECTION DEVICE OF AN ELECTRIC MOTOR

(71) Applicant: FANUC CORPORATION, Yamanashi (JP)

(72) Inventor: Tatsuya Senoo, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 14/643,175

(22) Filed: Mar. 10, 2015

(65) Prior Publication Data

US 2015/0263509 A1    Sep. 17, 2015

(30) Foreign Application Priority Data

Mar. 12, 2014   (JP) .................. 2014-049206

(51) Int. Cl.
| G05B 5/00 | (2006.01) |
| G01K 7/00 | (2006.01) |
| G01K 13/00 | (2006.01) |
| H02P 29/00 | (2016.01) |
| G01R 31/34 | (2006.01) |

(52) U.S. Cl.
CPC .............. *G01K 7/00* (2013.01); *G01K 13/00* (2013.01); *H02P 6/17* (2016.02); *H02P 29/0061* (2013.01); *H02P 29/66* (2016.02); *G01R 31/343* (2013.01)

(58) Field of Classification Search
CPC .............. H02P 6/14; H02P 6/003; H02P 6/16; H02K 29/08
USPC ............ 318/471, 432, 400.37, 400.39, 400.4
See application file for complete search history.

(56) References Cited

U.S. PATENT DOCUMENTS

| 6,854,881 B2 * | 2/2005 | Nada ..................... B60K 6/445 |
| | | 324/500 |
| 8,482,237 B2 * | 7/2013 | Berry ................... B60L 3/0061 |
| | | 236/67 |
| 8,487,575 B2 * | 7/2013 | Yeh ..................... H02P 29/0072 |
| | | 318/432 |
| 2011/0279074 A1 * | 11/2011 | Yeh .......................... G01K 7/42 |
| | | 318/432 |
| 2014/0354204 A1 * | 12/2014 | Tachibana ................ H02P 6/08 |
| | | 318/473 |

FOREIGN PATENT DOCUMENTS

| JP | H08182185 A | 7/1996 |
| JP | 2009089531 A | 4/2009 |
| JP | 5149431 B2 | 2/2013 |

OTHER PUBLICATIONS

English Translation of Japanese Publication No. 2009089531, published Apr. 23, 2009, 18 pages.

(Continued)

*Primary Examiner* — Rina Duda
(74) *Attorney, Agent, or Firm* — Fredrikson & Byron, P.A.

(57) ABSTRACT

A rotor temperature detecting device in an electric motor of the present invention includes: a power calculator configured to calculate power of an electric motor; a rotational speed detector configured to detect rotational speed of the electric motor; a storage configured to store coefficients depending on the rotational speed; and, a rotor temperature estimator configured to estimate temperature of a rotor of the electric motor, based on the power and the coefficient.

1 Claim, 7 Drawing Sheets

(56) References Cited

OTHER PUBLICATIONS

English Translation of Japanese Publication No. H08182185, published Jul. 12, 1996, 10 pages.
English abstract and machine translation for Japanese Publication No. JP 5149431 B2, published Feb. 20, 2013, 22 pgs.
Translated Decision to Grant a Patent for Japanese Application No. 2014-049206, Date of Mailing: Jan. 5, 2016, 3 pages.
Untranslated Decision to Grant a Patent for Japanese Application No. 2014-049206, Date of Mailing: Jan. 5, 2016, 3 pages.
Translated Notification of Reasons for Refusal for Japanese Application No. 2014-049206, Date of Mailing: Aug. 18, 2015, 3 pages.
Untranslated Notification of Reasons for Refusal for Japanese Application No. 2014-049206, Date of Mailing: Aug. 18, 2015, 3 pages.

* cited by examiner

ROTOR TEMPERATURE DETECTING DEVICE IN AN ELECTRIC MOTOR AND OVERHEAT PROTECTION DEVICE OF AN ELECTRIC MOTOR

CROSS-REFERENCE TO RELATED APPLICATIONS

This application is a new U.S. patent application that claims benefit of JP 2014-049206, filed on Mar. 12, 2014, the entire content of JP 2014-049206 is hereby incorporated by reference.

FIELD OF THE INVENTION

The present invention relates to a temperature detecting device of the rotor in an electric motor and an overheat protection device of an electric motor, in particular relating to a temperature detecting device of the rotor in an electric motor for exactly detecting the temperature of the rotor in accordance with the rotational speed of an electric motor and an overheat protection device of an electric motor.

BACKGROUND OF THE INVENTION

An electric motor is formed of a rotor and a stator. When the temperature of the rotor of the electric motor becomes high, heat transfers to the driven body so that various kinds of adverse influence such as thermal expansion of the driven body are feared to take place. Further, as to a rotor using permanent magnets, there is a possibility that the permanent magnets might be demagnetized at high temperature. Therefore, the control device of the electric motor is demanded to have a function of preventing overheat of the rotor.

As a method of preventing overheat of the rotor of an electric motor, there has been a known method in which the temperature of the rotor of the electric motor is estimated from the rotational speed and current of the electric motor (e.g., Japanese Patent 5149431 (JP 5149431B), which will be referred to hereinbelow as "Patent Document 1"). The above invention is roughly divided into two temperature estimation methods.

(i) Core loss is estimated and the estimated core loss is used to estimate the rotor temperature.
(ii) The rotor temperature is estimated by taking into account the heat transfer from the stator in addition to the core loss.

Herein, as explanation (ii), the temperature estimation formula is defined as follows:

$$T_r(t + \Delta t) = T_r(t) + \frac{p(t) + k_1(T_c(t) - T_r(t)) - k_2(T_r(t) - T_s)}{C} \Delta t$$

where,
t, Δt, t+Δt: time at which AC current is applied to the electric motor;
$T_r(t)$: rotor temperature at time t;
$T_r(t+\Delta t)$: rotor temperature at time (t+Δt)
$T_c(t)$: winding temperature at time t;
p(t): core loss at time t;
$T_S$: ambient temperature around the electric motor; and,
$k_1$, $k_2$, C: constants determined in accordance with the shape and material of the electric motor and the cooling condition of the stator.

As in the above formula, the equation is complicated, and therefore this method has the problem that not only each coefficient in the formula is difficult to determine but also the validity of each coefficient is hard to confirm.

On the other hand, as explanation (i), the temperature estimation formula is defined as follows:

$$T_r(t + \Delta t) = T_r(t) + \frac{p(t) - k(T_r(t) - T_s)}{C} \Delta t \quad (1)$$

where,
t, Δt, t+Δt: time at which AC current is applied to the electric motor;
$T_r(t)$: rotor temperature at time t;
$T_r(t+\Delta t)$: rotor temperature at time (t+Δt);
p(t): core loss at time t;
$T_S$: ambient temperature around the electric motor; and,
k, C: constants determined in accordance with the shape and material of the electric motor and the cooling condition of the stator.

Determination of coefficients and confirmation of their validity are easier in (i) compared to (ii), but (i) has the problem that the estimation accuracy is lower than that of (ii) because no consideration on heat transfer from the stator is given.

The reason why the estimation accuracy in the method (i) lowers will be described. It is possible to simplify the estimation formula of the core loss by flowing D-phase current so as to minimize eddy current while regarding that the hysteresis loss is sufficiently small. Specifically, in the core loss estimation formula in the prior art (see Patent Document 1) shown below:

$$p = \{a|I_q|^\alpha + b|c+I_d|^\alpha\}\omega^2 + \{e|I_q|^\beta + f|c+I_d|^\beta\}\omega$$

when $I_d = -c$, e=0 and f=0, the core loss estimation formula can be written as follows:

$$p = a|I_q|^\alpha \omega^2$$

Further, the index α may be empirically set at 2, and when taking into account that the Q-phase current $I_q$ is proportional to torque and that the power of the electric motor can be obtained by multiplying torque by the rotational speed, the core loss after simplification can be represented as follows:

$$p = kP^2 \quad (2)$$

where
P: power of the electric motor, and,
k: a proportionality coefficient.

On the basis of the above, it is possible to consider a method of continuously estimating the temperature of the rotor by monitoring the output power (or Q-phase current× rotational speed) of the electric motor.

However, when the temperature of the stator is high and hence a large amount of heat transfers from the stator to the rotor, it can be said that temperature estimation of the rotor based only on the power of the electric motor exposes a lower accuracy compared to the above method (ii).

The above problem will be explained by providing a specific example. A comparison is made between when the rotational speed is ω with torque of 2T and when the rotational speed is 2ω with torque of T. In both cases, the output power is 2Tω, hence the estimated core losses are the same. However, in the case with a rotational speed of ω, double torque is generated compared to the case with a rotational speed of 2ω. Therefore, doubled Q-phase current must flow. Accordingly, when considering copper loss of the stator, the copper loss at a rotational speed of ω becomes greater than the copper loss at a rotational speed of 2ω. Accordingly, the stator temperature (windings temperature) becomes high so that a greater amount of heat transfers from the stator to the rotor. As a result, it can be said that in the condition with the same power and the same core loss, the lower the speed the higher the actual temperature of the rotor becomes though the estimated temperature of the rotor is the same.

A more detailed explanation will be given as to the relation between the estimated rotor temperature and the actual rotor temperature when the electric motor is driven at a low rotational speed and at a high rotational speed. FIGS. 1A and 1B are graphs representing the estimated temperature and the actual temperature of a rotor when an electric motor is driven at a low rotational speed and at a high rotational speed, respectively. As depicted in FIG. 1A it is considered that when the electric motor is driven at a low rotational speed the actual temperature of the rotor becomes higher than the estimated temperature. On the other hand, as depicted in FIG. 1B it is considered that when the electric motor is driven at a high rotational speed the actual temperature of the rotor becomes lower than the estimated temperature. In this way, it can be said that at the lower speed the electric motor is driven, the higher the actual temperature of the rotor becomes.

It is therefore an object of the present invention to provide a temperature detecting device of the rotor in an electric motor and an overheat protection device of an electric motor that can achieve improved accuracy of temperature estimation by simply determining a coefficient for calculating the estimated temperature of the rotor.

SUMMARY OF THE INVENTION

A rotor temperature detecting device in an electric motor according to one embodiment of the present invention includes: a power calculator configured to calculate the power of an electric motor; a rotational speed detector configured to detect the rotational speed of the electric motor; a storage configured to store coefficients depending on the rotational speed; and, a rotor temperature estimator configured to estimate the temperature of the rotor of the electric motor, based on the power and the coefficient.

An overheat protection device of an electric motor according to another embodiment of the present invention includes: a power calculator configured to calculate the power of an electric motor; a rotational speed detector configured to detect the rotational speed of the electric motor; a storage configured to store coefficients depending on the rotational speed; a rotor temperature estimator configured to estimate the temperature of the rotor of the electric motor, based on the power and the coefficient; and, an overheat determination unit configured to determine whether the electric motor is in an overheated state, from the rotor temperature estimated by the rotor temperature estimator.

An overheat protection device of an electric motor according to still another embodiment of the present invention includes: a current detector configured to detect the current value of current supplied to the electric motor; a rotational speed detector configured to detect the rotational speed of the electric motor; a storage configured to store coefficients depending on the rotational speed; a rotor temperature estimator configured to estimate the temperature of the rotor of the electric motor, based on the current value, the rotational speed, and the coefficient; and, an overheat determination unit configured to determine whether the electric motor is in an overheated state, from the rotor temperature estimated by the rotor temperature estimator, and is constructed such that when the rotational speed is equal to or lower than a predetermined threshold, the overheat determination unit determines whether the electric motor is in an overheated state, based on the temperature of the rotor estimated by assuming that the motor is driven at a rotational speed equal to the threshold.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Referring next to the drawings, a temperature detecting device of the rotor of an electric motor and an overheat protection device of an electric motor according to the present invention will be described. However, it should be noted that the technical scope of the present invention is not limited by the embodied mode of these but embraces the inventions defined by the claims and equivalence.

[First Embodiment]

Figure 1A:
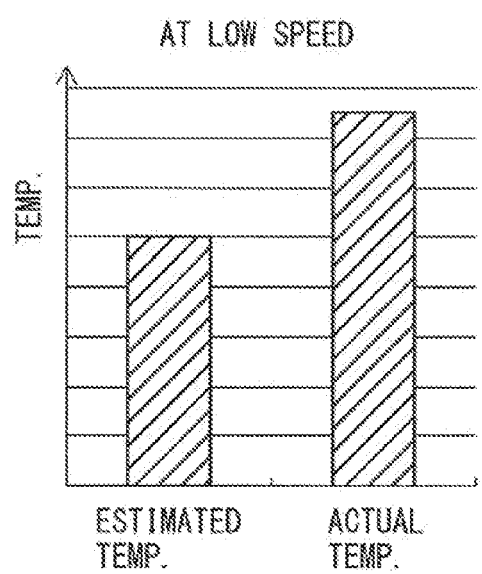
FIG. 1A is a graph for comparing the estimated temperature and actual temperature of the rotor when the motor is driven at a low rotational speed.
Figure 1B:
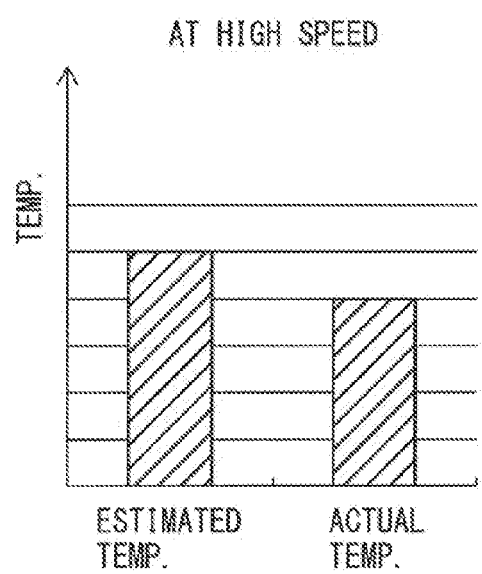
FIG. 1B is a graph for comparing the estimated temperature and actual temperature of the rotor when the motor is driven at a high rotational speed.
Figure 2:
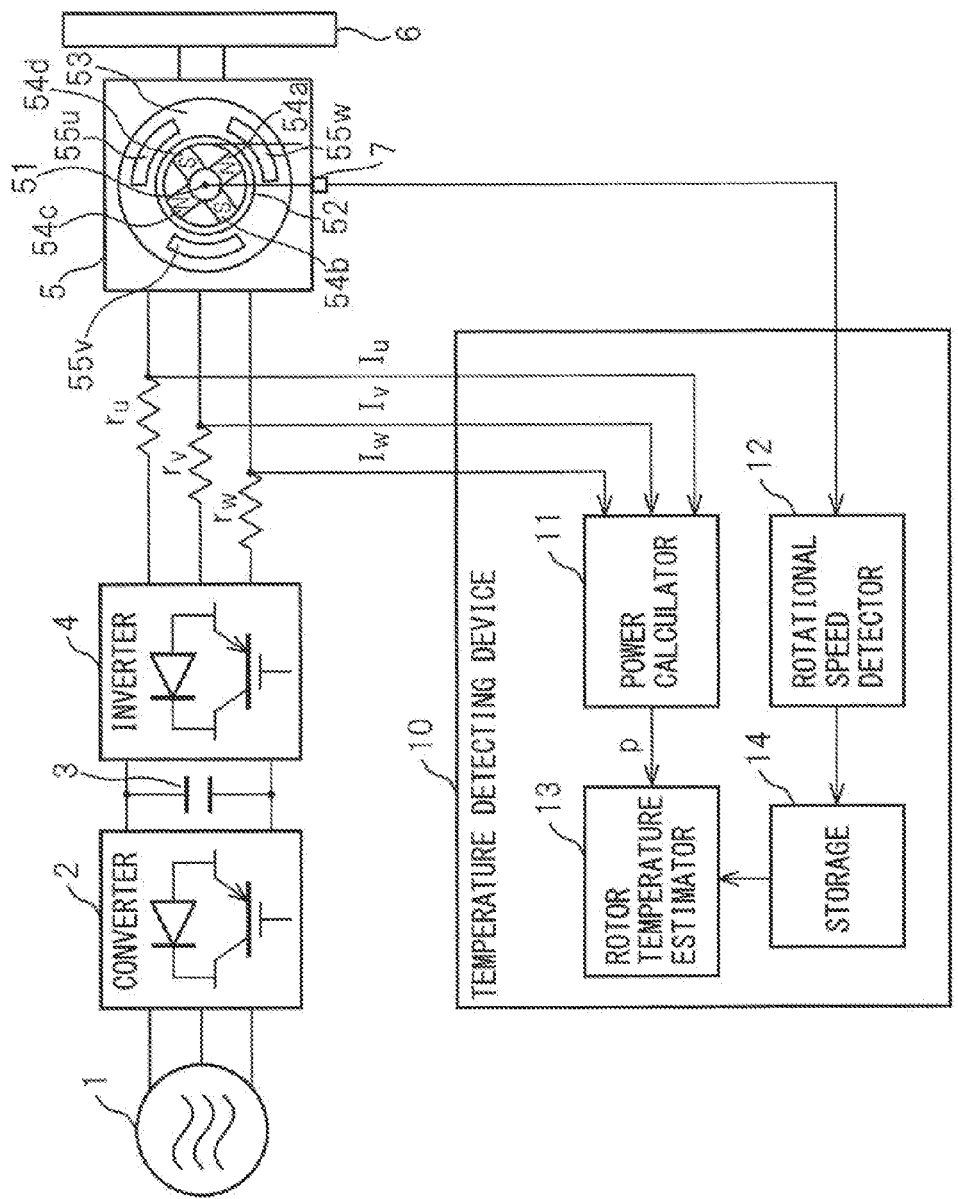
FIG. 2 is a block diagram depicting an electric motor drive system including a temperature detecting device according to a first embodiment of the present invention.

A temperature detecting device according to a first embodiment of the present invention will be described with reference to the drawings. FIG. 2 is a block diagram of an electric motor drive system including a temperature detecting device according to the first embodiment of the present invention. A temperature detecting device 10 according to the first embodiment of the present invention includes: a power calculator 11 configured to calculate the power of an electric motor 5; a rotational speed detector 12 configured to detect the rotational speed of the electric motor 5; a storage 14 configured to store coefficients depending on the rotational speed; and a rotor temperature estimator 13 configured to estimating the temperature of a rotor 52 of the electric motor 5 based on the power of the electric motor and a coefficient.

The electric motor drive system depicted in FIG. 2 includes an AC power supply 1, a converter 2, a smoothing capacitor 3, an inverter 4, an electric motor 5 and a temperature detecting device 10.

The converter 2 converts AC voltage supplied from the AC power supply 1 into DC voltage to be output. The output DC voltage is smoothed by the smoothing capacitor 3 and supplied to the inverter 4. The inverter 4 converts the input DC voltage into AC voltage and supplies voltage to the electric motor 5 via resistors $r_u$, $r_v$ and $r_w$. The electric motor 5 drives a driven body 6 by the power supplied from the inverter 4.

The electric motor 5 includes a rotor 52 that rotates about a rotational axis 51 and a stator 53. The rotor 52 is formed with permanent magnets 54a, 54b, 54c and 54d. The stator 53 is formed with windings 55u, 55v and 55w. The rotor 52 rotates by interaction between the magnetic field generated by the currents flowing through the windings 55u, 55v and 55w and the magnetic field generated by permanent magnets 54a, 54b, 54c and 54d.

The rotational speed of the rotor 52 can be detected by an encoder 7 provided for the electric motor 5.

The temperature detecting device 10 includes a power calculator 11, a rotational speed detector 12, a storage 14 and a rotor temperature estimator 13.

The power calculator 11 detects u-phase current $I_u$, v-phase current $I_v$, and w-phase current $I_w$, supplied from the inverter 4 to the electric motor 5 and calculates the output power of the electric motor based on the detected $I_u$, $I_v$ and $I_w$. Alternatively, when the moment of inertia of the pair of the rotor and driven body is known, it is possible to calculate the output power of the electric motor by multiplying the moment of inertia by the rotational speed and angular acceleration. The rotational speed can be obtained by the rotational speed detector 12. The angular acceleration can be obtained by the change of the rotational speed with respect to time.

The rotational speed detector 12 receives signals from the encoder 7 and detects the rotational speed of the rotor 52 from the received signals.

The storage 14 stores coefficients depending on the rotational speed. Herein, the storage 14 stores coefficients in the form of a table that represents the relationship between the rotational speed and the coefficient. However, the storing method is not limited to this. A relational expression that represents the relationship between the rotational speed and the coefficient may be stored.

The rotor temperature estimator 13 estimates the temperature of the rotor 52 of the electric motor 5 using the power of the electric motor 5 and the coefficient stored in the storage 14. The rotor temperature estimate method will be described in detail.

In the first embodiment of the present invention, the temperature of the rotor is estimated based on the square of the power of the electric motor (or Q-phase current×rotational speed) multiplied by the coefficient depending on the rotational speed. That is, the expression of core loss estimation is rewritten by using the following equation as the heat that is generated in, or given to, the rotor.

$$W = P^2 \phi(\omega)$$

where
W: heat generated in, or given to, the rotor;
P: power of the electric motor; and,
$\phi(\omega)$: speed-dependent coefficient (greater as the speed is lowered).

The heat estimation method other than the way the above estimation formula of heat is determined, may be done in the same manner as in the prior art. For example, the core loss, p(t) in the above temperature estimation formula of Eq. (1) may be replaced by W in the above expression.

$$T_r(t + \Delta t) = T_r(t) + \frac{W - k(T_r(t) - T_s)}{C} \Delta t$$

where,
t, $\Delta t$, t+$\Delta t$: time at which AC current is applied to the electric motor;
$T_r(t)$: rotor temperature at time t;
$T_r(t+\Delta t)$: rotor temperature at time (t+$\Delta t$);
W: heat generated in, or given to, the rotor;
$T_S$: ambient temperature around the electric motor; and,
k, C: constants determined in accordance with the shape and material of the electric motor and the cooling condition of the stator.

In comparison with the conventional expression (1) that is formulated on the assumption that core loss is the only heat source, the prior art problem that "even though the estimated temperatures of the rotor always take the same value, in practice the lower the rotational speed of the rotor the more the temperature of the rotor rises", can be dissolved. That is, when the output powers of the motor are equal, it is possible to estimate a higher rotor temperature for the electric motor that is driven at a lower speed, instead of estimating the same rotor temperature.

Next, the method of determining the speed-dependent coefficient will be described in detail. Since description on other than the method of determining the speed-dependent coefficient $\phi(\omega)$) is the same as that for the prior art (see Patent Document 1), detailed description is omitted. Hereinbelow, the method of determining the speed-dependent coefficient $\phi(\omega)$ will be described by providing an example.

First, a device or other element for directly detecting the temperature of the rotor has been attached beforehand. It is preferable that the device can wirelessly transmit the detected value in order to allow sampling of the detected value even when the rotor is rotated at a high speed. This device is used only for the test motor for determining the speed-dependent coefficient $\phi(\omega)$. That is, after determination of the speed-dependent coefficient $\phi(\omega)$, it is not necessary to provide the device for directly detecting the temperature for the rotor.

The saturation temperature of the rotor when the rotational speed is fixed, hence the output power is constant, is measured. This measurement is repeated by changing the rotational speed.

Figure 3:
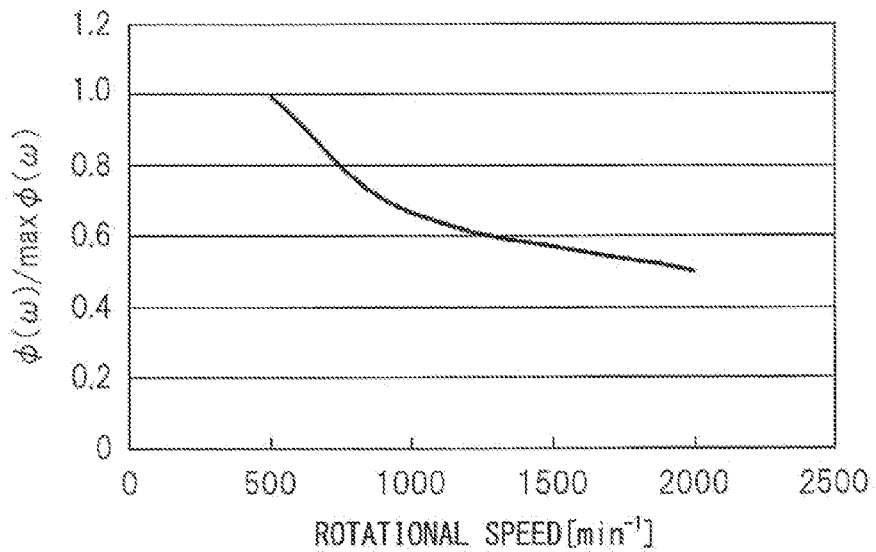
FIG. 3 is a graph representing rotational speed dependence of $\phi(\omega)/\max\phi(\omega)$, the value of the speed-dependent coefficient $\phi(\omega)$ normalized by $\max\phi(\omega)$.

Determined from the relationship between the rotational speed and the temperature rise of the rotor is how the speed-dependent coefficient $\phi(\omega)$ changes. For example, when it is assumed that $\phi(\omega)$ is proportional to temperature rise while $\phi(\omega)$ at a rotational speed of 500 [min$^{-1}$] takes the maximum of $\phi(\omega)$ (max$\phi(\omega)$), $\phi(\omega)$/max$\phi(\omega)$ varies as depicted in FIG. 3 with respect to the rotational speed, for the case where temperature rise in the table below is observed.

<Example> Output Power: 50 [kw], Room Temp.: 20[° C.]

| Rotational Speed | Rotor Saturation Temperature | Rotor Temperature Rise |
|---|---|---|
| 500 [min$^{-1}$] | 80 [° C.] | 60 [° C.] |
| 1000 [min$^{-1}$] | 60 [° C.] | 40 [° C.] |
| 2000 [min$^{-1}$] | 50 [° C.] | 30 [° C.] |

Though the degree of change can be determined as above, the absolute value needs to be determined by use of the following equation with assigned values by changing the power, or by finite element analytical approach or the like.

$$T_r(t+\Delta t) = T_r(t) + \frac{W - k(T_r(t) - T_s)}{C} \Delta t$$

Since this is equivalent to the process of determining the coefficient 'a' in the following equation similarly to the simplified equation (2) of core loss described above, the calculation can be done without difficulty.

$$p = aP^2$$

To detect the rotational speed, various methods can be used. For example, the rotational speed can be determined by differentiating the detected value of the angle detector by time. However, for a synchronous motor, the rotational speed is proportional to the frequency of current, so that it is also possible to use a method of monitoring the current and converting it into rotational speed by calculation. This means that the angle detector is not the only method.

Figure 4:
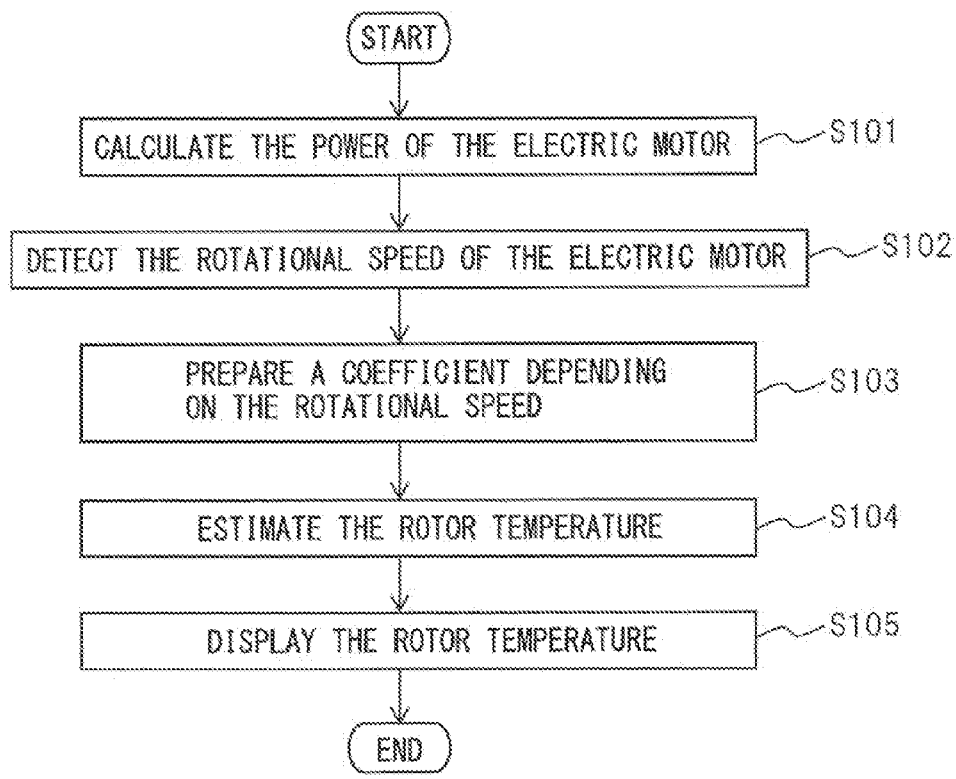
FIG. 4 is a flow chart for explaining the operational steps of a temperature detecting device according to the first embodiment of the present invention.

Next, the operational procedures of the temperature detecting device according to the first embodiment of the present invention will be described with reference to the flow chart in FIG. 4. First, at Step S101 the power calculator 11 calculates the power of the electric motor 5. In the present embodiment, the power of the electric motor is calculated by providing an example of calculation based on the current supplied to the electric motor. However, calculation of the power of the electric motor may be carried out by another method, not limited to this.

Next, at Step S102 the rotational speed detector 12 detects the rotational speed of the electric motor 5, based on the signals from the encoder 7.

Next, at Step 103 a coefficient depending on the rotational speed is prepared. This is done by the rotor temperature estimator 13 reading out a coefficient that is stored in the storage 14 in relation to the rotational speed, from the storage 14. Herein, the storage 14 stores coefficients in a table format that represents the relationship between the rotational speed and the coefficient. However, not limited to this, a relational expression that represents the relationship between the rotational speed and the coefficient may be stored.

Next, at Step 104 the rotor temperature estimator 13 estimates the temperature of the rotor 52 of the electric motor 5, based on the calculated power of the electric motor 5 and the coefficient that depends on the rotational speed and is stored in storage 14. Thus, the estimation method of the temperature of the rotor is described as above.

Next, at Step 105 the estimated temperature of the rotor estimated by the rotor temperature estimator 13 is displayed on a display device provided for the temperature detecting device 10 or a display device (not illustrated) provided outside the temperature detecting device 10.

Use of the temperature detecting device according to the first embodiment makes coefficient determination easy and dissolve the prior art problem that "even though the estimated temperatures of the rotor always take the same value, in practice the lower the rotational speed of the rotor the more the temperature of the rotor rises".

[Second Embodiment]

Figure 5:
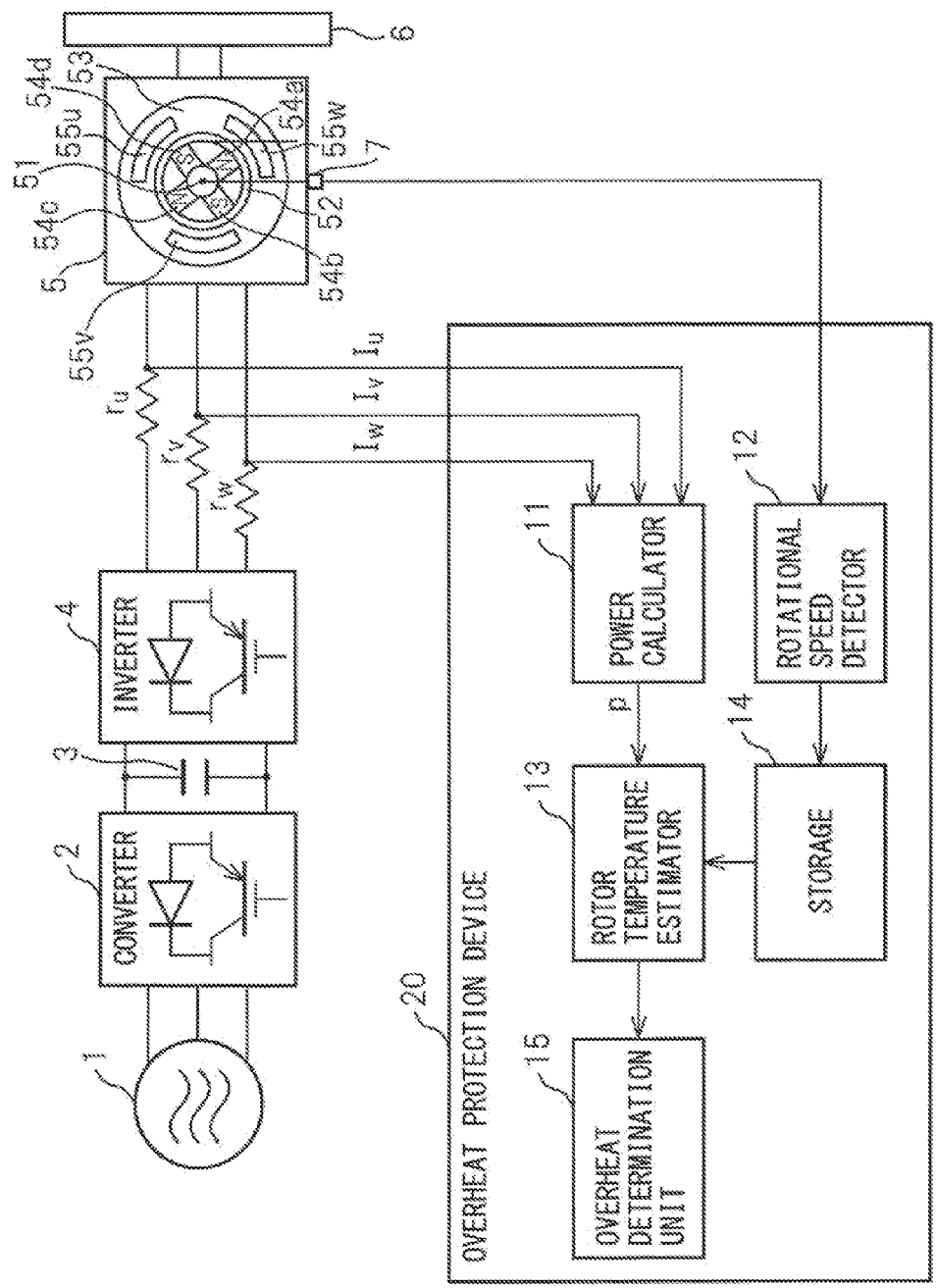
FIG. 5 is a block diagram depicting an electric motor drive system including an overheat protection device according to a second embodiment of the present invention.

Next, an overheat protection device according to a second embodiment of the present invention will be described. FIG. 5 is a block diagram of an electric motor drive system including an overheat protection device of an electric motor according to the second embodiment of the present invention. An overheat protection device 20 of an electric motor according to the second embodiment of the present invention includes: a power calculator 11 configured to calculate the power of an electric motor 5; a rotational speed detector 12 configured to detect the rotational speed of the electric motor 5; a storage 14 configured to store coefficients depending on the rotational speed; a rotor temperature estimator 13 configured to estimate the temperature of a rotor 52 of the electric motor 5 based on the power of the electric motor 5 and the coefficient; and, an overheat determination unit 15 configured to determine whether the electric motor 5 is in an overheated state, based on the rotor temperature estimated by the rotor temperature estimator 13. The other configuration of the electric motor drive system is the same as that described in the first embodiment, and therefore a detailed description is omitted.

The overheat determination unit 15 may be constructed so as to generate an alarm when the electric motor is determined to be in an overheated state. For example, it is possible to adapt a display (not illustrated) outside the overheat protection device 20 to display an alarm. With this arrangement, the user is able to determine that the electric motor is in an overheated state.

Figure 6:
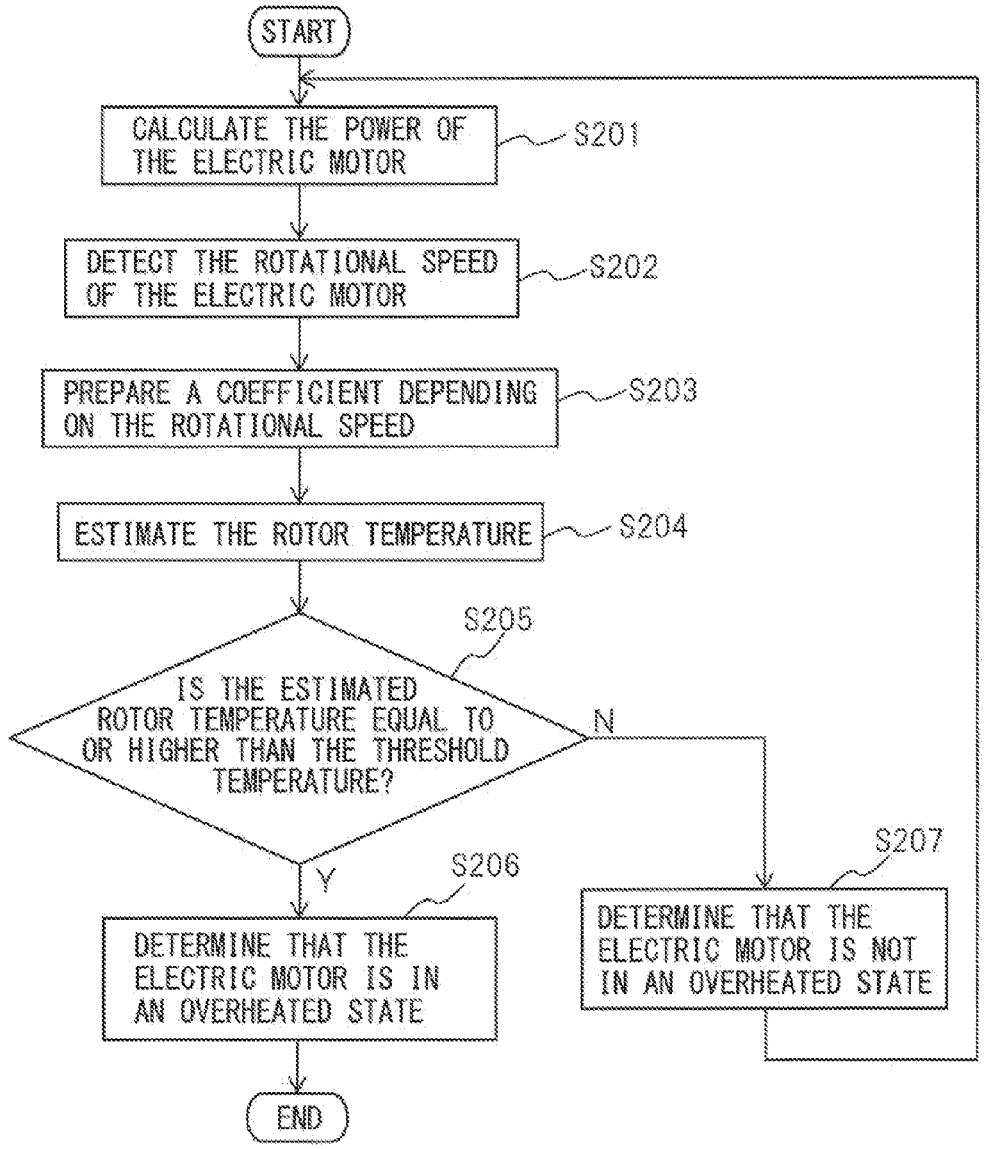
FIG. 6 is a flow chart for explaining the operational steps of an overheat protection device according to the second embodiment of the present invention.

Next, the operational procedures of the overheat protection device according to the second embodiment of the present invention will be described using the flow chart given in FIG. 6. First, at Step S201 the power calculator 11 calculates the power of the electric motor 5. The method of calculating the power of the electric motor is the same as that in the first embodiment.

Next, at Step S202 the rotational speed detector 12 detects the rotational speed of the electric motor 5, based on the signals from the encoder 7.

Next, at Step 203 a coefficient depending on the rotational speed is prepared. This is done by the rotor temperature estimator 13 reading out a coefficient that is stored in the storage 14 in relation to the rotational speed, from the storage 14. Herein, the storage 14 stores coefficients in a table format that represents the relationship between the rotational speed and the coefficient. However, not limited to this, a relational expression that gives the relationship between the rotational speed and the coefficient may be stored.

Next, at Step 204 the rotor temperature estimator 13 estimates the temperature of the rotor 52 of the electric motor 5, based on the calculated power of the electric motor 5 and the coefficient that depends on the rotational speed and is stored in storage 14. The estimation method of the temperature of the rotor is effected as described above.

Next, at Step 205 the overheat determination unit 15 determines whether the estimated rotor temperature of estimated by the rotor temperature estimator 13 is equal to or higher than a predetermined threshold temperature. This predetermined threshold temperature has been also stored in the storage 14 so as to allow the overheat determination unit 15 to retrieve it from the storage 14.

When the overheat determination unit 15 has determined that the estimated rotor temperature is equal to or higher than the threshold temperature, at Step S206 the electric motor 5 is determined to be in an overheated state, and the control is ended.

On the other hand, when the overheat determination unit 15 has determined that the estimated rotor temperature is lower than the threshold temperature, at Step S207 the electric motor 5 is determined not to be in an overheated state, and the control goes back to Step S201 so that the process of estimating the temperature of the rotor is repeated.

As described heretofore, since the overheat protection device according to the second embodiment includes the overheat determination unit that determines whether the rotor is in an overheated state, based on the estimated rotor temperature, it is possible to correctly grasp an overheated state of the rotor, hence prevent the rotor from being damaged or degraded by overheating.

[Third Embodiment]

Figure 7:
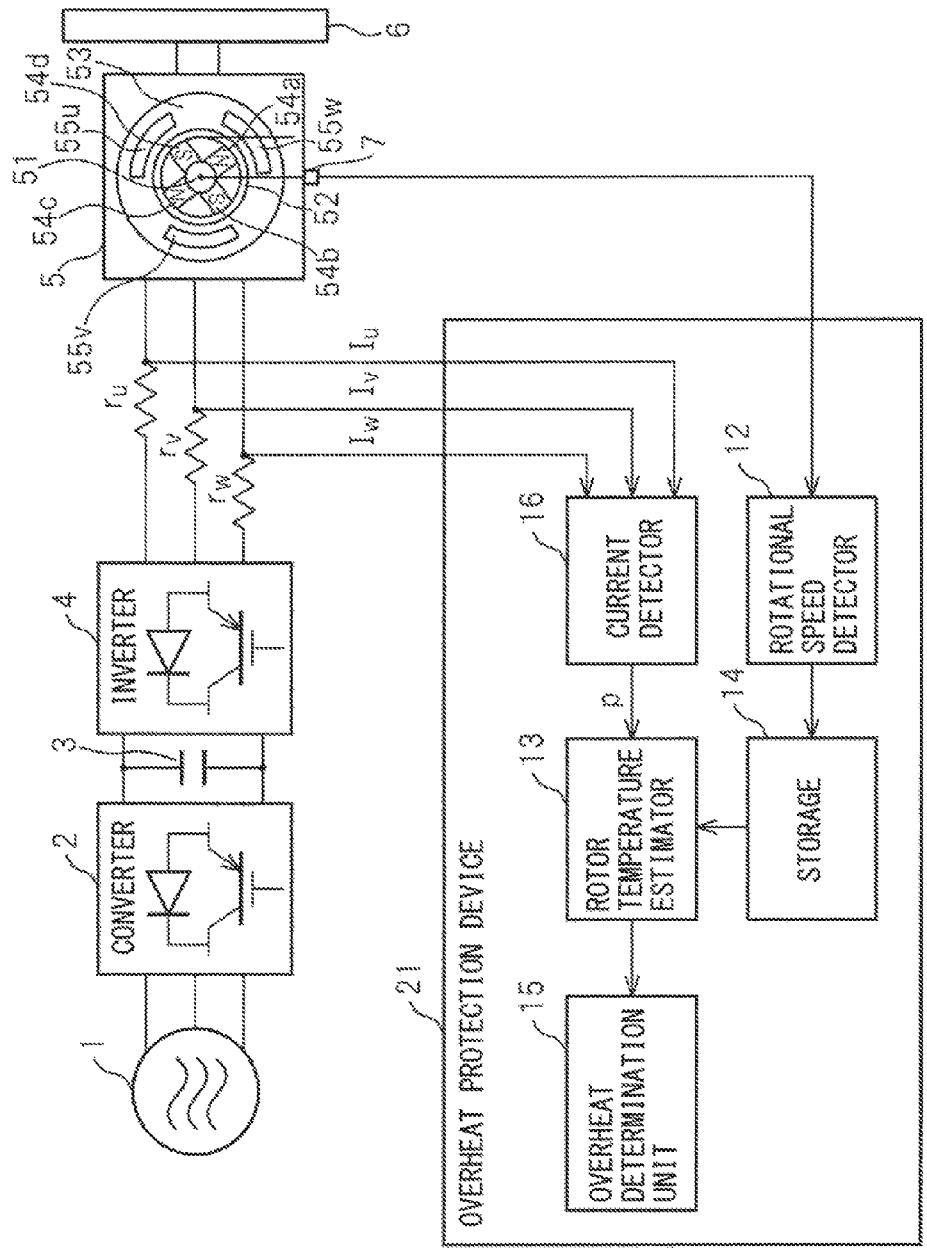
FIG. 7 is a block diagram depicting an electric motor drive system including an overheat protection device according to a third embodiment of the present invention; and, FIG. 8 is a flow chart for explaining the operational steps of an overheat protection device according to the third embodiment of the present invention.

Next, an overheat protection device according to a third embodiment of the present invention will be described. FIG. 7 is a block diagram depicting an electric motor drive system including an overheat protection device of an electric motor according to the third embodiment of the present invention. An overheat protection device 21 of an electric motor according to the third embodiment of the present invention includes: a current detector 16 configured to detect the current value of the current supplied to an electric motor 5; a rotational speed detector 12 configured to detect the rotational speed of the electric motor 5; a storage 14 configured to store coefficients depending on the rotational speed; a rotor temperature estimator 13 configured to estimate the temperature of the rotor of the electric motor based on the current value, rotational speed and coefficient; and, an overheat determination unit 15 configured to determine whether the electric motor is in an overheated state, based on the rotor temperature estimated by the rotor temperature estimator 13, and wherein, when the rotational speed is equal to or lower than a predetermined threshold, the overheat determination unit 15 determines whether the electric motor is in an overheated state, based on the rotor temperature that is estimated by assuming the rotational speed to be equal to the threshold.

There have been generally known electric motors that protect the windings by monitoring the currents to estimate the temperature of the windings in addition to the rotor. If the rotor temperature is estimated in addition to estimation of the winding temperature by the above means, two items have to be estimated, which leads to an increase in the amount of sequential computation. Since the amount of computation is preferably cut down in the environment in which control of electric motors becomes complicated, the overheat protection device according to the third embodiment is characterized by protecting both the windings and the rotor by use of only a single item for temperature estimation.

Since the current is monitored in the present embodiment, it is possible to use (torque constant)×(Q-phase current)× (rotational speed) as an alternative of the electric motor's power. That is, the heat estimation formula can be given by the following expression:

$$W = (K_t I_q \omega)^2 \phi(\omega)$$

where, $K_t$: torque constant,
$I_q$: Q-phase current, and
$\omega$: rotational speed.

When the electric motor is driven at high rotational speeds, the current flowing through the stator is limited by protection for the rotor based on $W=(K_t I_q \omega)^2 \phi(\omega)$, and therefore it is rarely considered that the windings of the rotor are overheated.

However, when the electric motor is driven at low rotational speeds, for example when $\omega$ is sufficiently small, W becomes small even if $I_q$ and $\phi(\omega)$ are large, so that no alarm is generated based on the value of W and overheat for windings cannot be prevented.

To deal with this, a threshold is assigned to the rotational speed so as to generate an alarm by regarding $\omega$ as a fixed value when the rotational speed is lower than the threshold. By this arrangement, W increases for large $I_q$ when $\phi(\sigma)$ is given appropriately, so that it is possible to generate an alarm to prevent against overheat of the windings.

Next, specific explanation will be given. For example, the threshold of the rotational speed is set at 100 [min$^{-1}$]. For simplicity, $\phi(\omega)$ is fixed at 1 when the rotational speed is equal to or lower than the threshold.

In the method of the first embodiment, the estimated value of heat in the case where the motor is driven at a rotational speed of 20 [min$^{-1}$] with torque of 100 [Nm] and that in the case where the motor is driven at a rotational speed of 100 [min$^{-1}$] with torque of 20 [Nm] are equal. However, core loss can be neglected at low speeds, whereas the current flowing through the windings is proportional to torque so that the current ratio results in 5:1. Therefore, the ratio of generated heat in windings is 25:1. This result does not validate the above result of estimation.

To deal with this, even when the rotational speed is 20 [min$^{-1}$], which is equal to or lower than the threshold, the threshold rotational speed, i.e., 100 [min$^{-1}$], is used instead in heat estimation. As a result, the power ratio of the case of a rotational speed of 20 [min$^{-1}$] with torque of 100 [Nm] and the case of a rotational speed of 100 [min$^{-1}$] with torque of 20 [Nm] is determined to be 5:1 even though the actual power is equal. Accordingly, the ratio of heat is estimated to be 25:1, so that the above problem can be solved.

Figure 8:
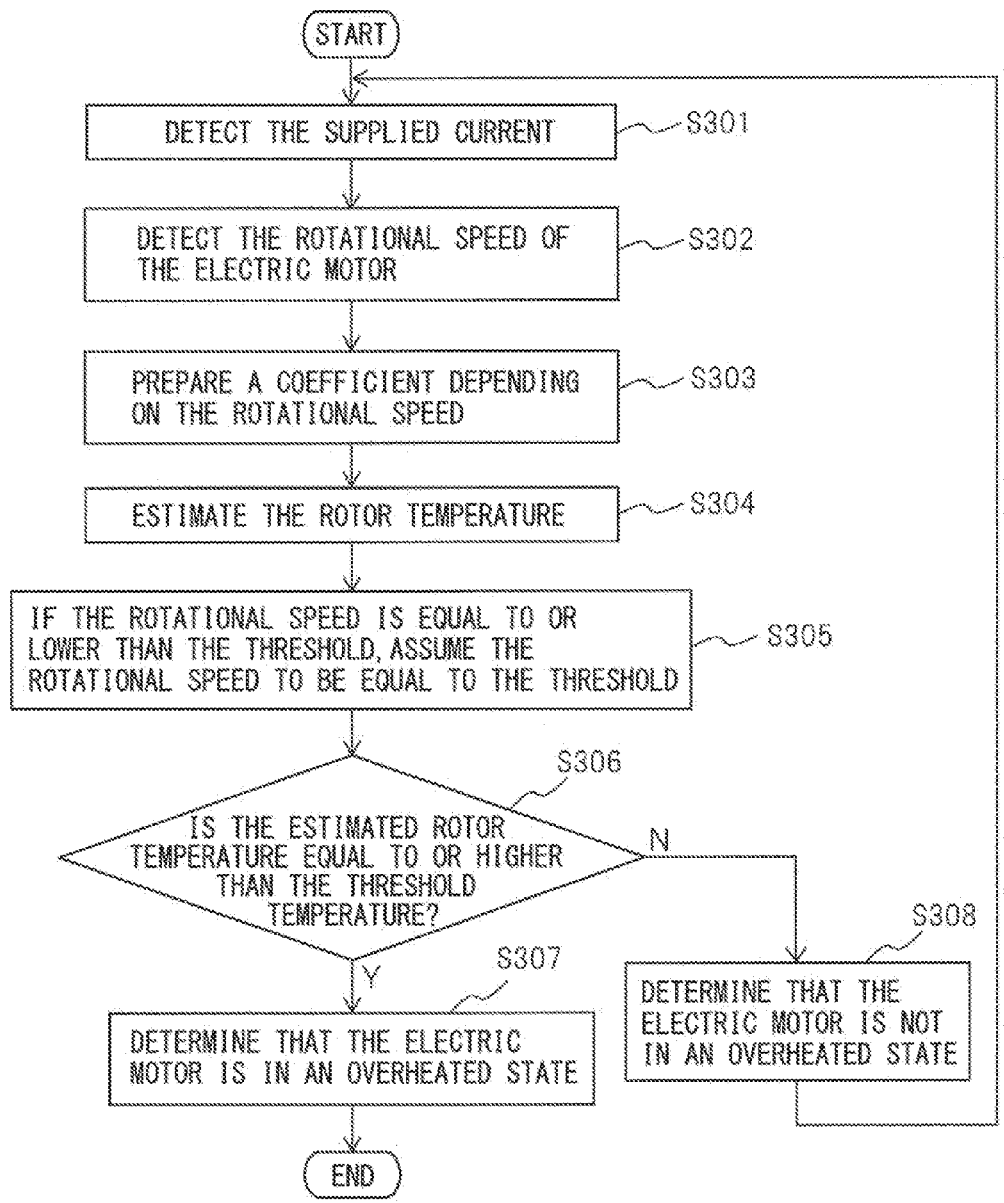

Next, the operational procedures of the overheat protection device according to the third embodiment of the present invention will be described with reference to the flow chart given in FIG. 8. First, at Step S301 the current detector 16 detects the current value of the current supplied to the electric motor 5.

Next, at Step S302 the rotational speed detector 12 detects the rotational speed of the electric motor 5 based on the signals from encoder 7.

Next, at Step 303 a coefficient depending on the rotational speed is prepared. This is done by the rotor temperature estimator 13 reading out a coefficient that is stored in the storage 14 in relation to the rotational speed, from the storage 14. Herein, the storage 14 stores coefficients in a table format that represents the relationship between the rotational speed and the coefficient. However, not limited to this, a relational expression that gives the relationship between the rotational speed and the coefficient may be stored.

Next, at Step 304 the rotor temperature estimator 13 estimates the temperature of the rotor 52 of the electric motor 5, based on the detected current value of the electric motor 5, the detected rotational speed of the electric motor 5 and the coefficient that depends on the rotational speed and is stored in storage 14.

Next, at Step S305 the overheat determination unit 15 regards that the motor is driven at a rotational speed equal to the threshold when the rotational speed is equal to or lower than the threshold. This determination method is carried out as described above.

Next, at Step 306 the overheat determination unit 15 determines whether the estimated temperature of the rotor estimated by the rotor temperature estimator 13 is equal to or higher than a predetermined threshold temperature. This predetermined threshold temperature has been also stored in the storage 14 so as to allow the overheat determination unit 15 to retrieve it from the storage 14.

In the above way, in Steps S305 to S306, the overheat determination unit 15 determines whether the motor is in an overheated state, based on the estimated temperature of the rotor by assuming that the motor is driven at the threshold rotational speed though the actual rotational speed is equal to or lower than the threshold.

When the overheat determination unit 15 has determined that the estimated rotor temperature is equal to or higher than the threshold temperature, at Step S307 the electric motor 5 is determined to be in an overheated state, and the control is ended.

On the other hand, when the overheat determination unit 15 has determined that the estimated rotor temperature is lower than the threshold temperature, at Step S308 the electric motor 5 is determined not to be in an overheated state, and the control returns back to Step S301 so that the process of estimating the temperature of the rotor is repeated.

The overheat determination unit may be constructed so as to generate an alarm when the electric motor has been determined to be in an overheated state. It is also possible to adapt a display (not illustrated) outside the overheat protection device to display that the rotor is in an overhead state.

As described heretofore, according to the overheat protection device according to the third embodiment, it is possible to correctly calculate the estimated temperature of the rotor even when the rotor is driven at a rotational speed equal to lower than the predetermined threshold, and from the detected current it is possible to correctly determine whether the rotor is in an overheated state.

According to the present invention, it is possible to provide a temperature detecting device of the rotor of an electric motor and an overheat protection device of an electric motor that can achieve improved accuracy of temperature estimation by simply determining a coefficient for calculating the estimated temperature of the rotor.

What is claimed is:

1. An overheat protection device of an electric motor, comprising:
   a current detector configured to detect current value of current supplied to the electric motor;
   a rotational speed detector configured to detect rotational speed of the electric motor;
   a storage configured to store coefficients depending on the rotational speed;
   a rotor temperature estimator configured to estimate temperature of a rotor of the electric motor, based on the current value, the rotational speed, and the coefficient; and,
   an overheat determination unit configured to determine whether the electric motor is in an overheated state, from the rotor temperature estimated by the rotor temperature estimator,
   wherein, when the rotational speed is equal to or lower than a predetermined threshold, the overheat determination unit determines whether the electric motor is in an overheated state, based on the temperature of the rotor estimated by assuming that the motor is driven at rotational speed equal to the threshold.

* * * * *